(12) United States Patent  
Yee

(10) Patent No.: US 8,003,426 B2  
(45) Date of Patent: Aug. 23, 2011

(54) METHOD FOR MANUFACTURING PACKAGE STRUCTURE OF OPTICAL DEVICE

(75) Inventor: Kuo-Chung Yee, Taipei (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 155 days.

(21) Appl. No.: 12/471,455

(22) Filed: May 25, 2009

(65) Prior Publication Data

US 2009/0239329 A1    Sep. 24, 2009

Related U.S. Application Data

(62) Division of application No. 10/906,095, filed on Feb. 3, 2005, now abandoned.

(30) Foreign Application Priority Data

Feb. 6, 2004    (TW) ................................ 93102847 A

(51) Int. Cl.  
*H01L 21/00* (2006.01)

(52) U.S. Cl. ................. 438/68; 438/64; 438/65

(58) Field of Classification Search .............. 438/25, 438/27, 33, 65, 68, 113, 458, 460, 462, 464, 438/64  
See application file for complete search history.

(56) References Cited

U.S. PATENT DOCUMENTS

| | | | | |
|---|---|---|---|---|
| 5,786,266 | A * | 7/1998 | Boruta | 438/462 |
| 5,904,548 | A * | 5/1999 | Orcutt | 438/462 |
| 6,271,102 | B1 * | 8/2001 | Brouillette et al. | 438/462 |
| 6,518,079 | B2 * | 2/2003 | Imler | 438/33 |
| 7,001,797 | B2 * | 2/2006 | Hashimoto | 438/113 |
| 7,012,012 | B2 * | 3/2006 | Yeom et al. | 438/462 |
| 7,405,100 | B1 * | 7/2008 | Mostafazadeh et al. | 438/68 |

* cited by examiner

*Primary Examiner* — Kevin M Picardat  
(74) *Attorney, Agent, or Firm* — Jianq Chyun IP Office

(57) ABSTRACT

A package structure of optical devices has a chip, a sealant, a cover, a substrate, a plurality of bonding wires, and a transparent encapsulant. The chip has at least an optical device and a plurality of chip connection pads. The sealant is disposed around the optical elements. The cover is disposed on the sealant. The substrate supports the chip and has a plurality of connection pads. The bonding wires are used for electrically connecting the chip connection pads of the chip to the connection pads of the substrate. The transparent encapsulant is formed over the substrate and the cover, and encapsulates the bonding wires.

14 Claims, 6 Drawing Sheets

METHOD FOR MANUFACTURING PACKAGE STRUCTURE OF OPTICAL DEVICE

CROSS-REFERENCE TO RELATED APPLICATION

This application is a divisional application of and claims the priority benefit of U.S. application Ser. No. 10/906,095, filed on Feb. 3, 2005, which claims the priority benefit of Taiwan application serial No. 93102847, filed on Feb. 6, 2004. The entirety of each of the above-mentioned patent applications is hereby incorporated by reference herein and made a part of this specification.

BACKGROUND OF THE INVENTION

1. Field of Invention

The present invention relates to a package structure of optical semiconductor integrated circuit device. More particularly, the invention relates to a fabrication method for a package structure of semiconductor integrated circuit having an optical device.

2. Description of Related Art

In the general photoelectric applications, in order to protect the optical device in the form of integrated circuit chip, such as image sensor chip, from being physical damage and environmental contamination, the image sensor chip in practical situation is disposed in a package structure. The package structure has an opening, which is sealed by a transparent cover, so that the image sensor chip can sense the optical signals.

For example, the image sensor chip usually is implemented on a ceramic substrate with protruding pins by using a molding layer. The molding layer usually needs the curing process, so as to firmly implement the image sensing device on the ceramic substrate. After bonding wire and window sealing, the pins are cut to have a proper length. The final structure is achieved and the package process is accomplished.

In the fabrication process about sealing the window, typically, it uses a work process by distributing or molding, so that the molding compound encloses the image sensing device, which is then implemented on the substrate. After then, a transparent cover is disposed over the molding compound, so as to seal the image sensing device between the substrate and the cover. For example, the U.S. Pat. No. 5,811,799 issued to Wu on Sep. 22, 1998 by a title "Image Sensor Package Having A Wall with A Sealed Cover" has disclosed a package structure of image sensor, in which a pre-molded wall is used to package an image sensor chip on a ceramic substrate. The foregoing package structure of the optical device is easily warped, and therefore it needs the ceramic substrate that is rather expensive.

Therefore, it is necessary for the manufacturers in packaging the optical device to provide a package structure of the optical device, so as to reduce the fabrication cost.

SUMMARY OF THE INVENTION

The invention provides a package structure of optical semiconductor integrated circuit device, so as to reduce the fabrication cost.

The invention provides a package structure of optical devices, including a chip, a sealant, a cover, a substrate, multiple bonding wires, and a transparent encapsulant. The chip has an optical device and multiple chip connection pads. The sealant is disposed to enclose the optical device. The cover is disposed on the sealant. The substrate supports the chips and has multiple connection pads. The bonding wires are used to electrically connect the chip connection pads of the chip to the connection pads of the substrate. The transparent encapsulant is formed over the substrate and the cover, and enclosing the bonding wires.

According to the present invention, the package structure of optical device has a cover, which covers over the optical device of the chip, so that it is helpful to prevent from the moisture and reduce the warpage. The package structure of optical device can use a usual substrate in completion without need of the expensive ceramic or bisma-leimide triazine resin as the substrate. As a result, the fabrication cost is greatly reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
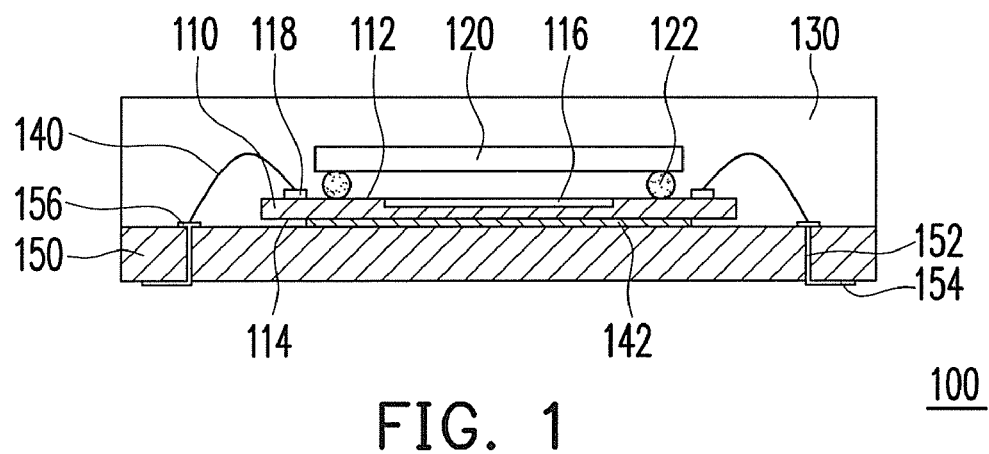
FIG. 1 is a cross-sectional view, schematically illustrating a package structure of optical device, according to preferred embodiment of the invention.
Figure 2:
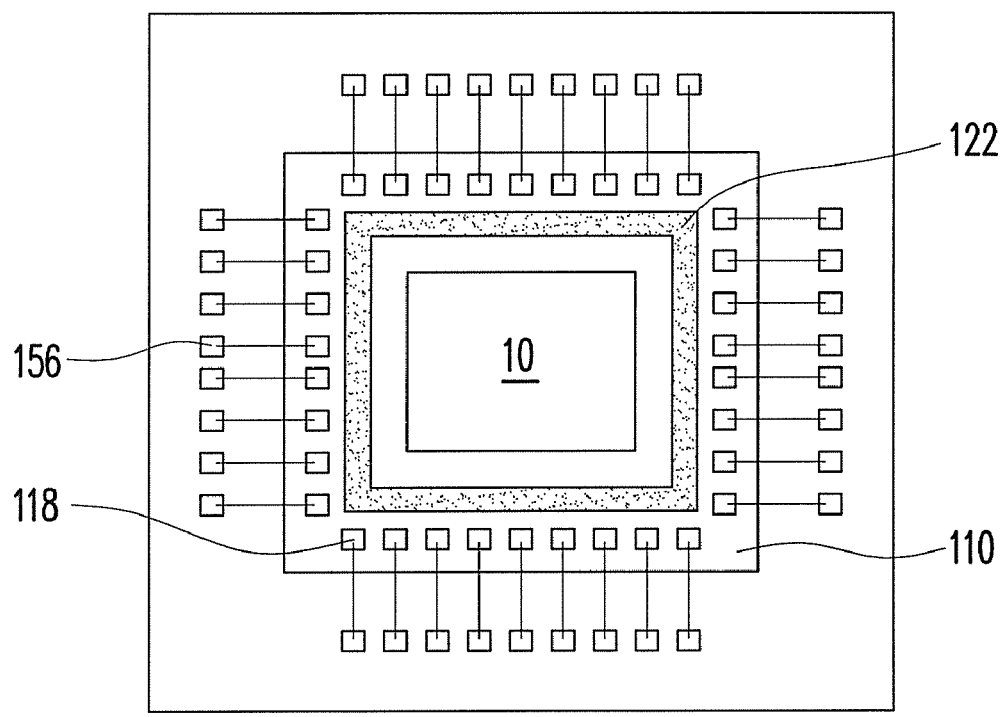
FIG. 2 is a top view, schematically illustrating a package structure of optical device of FIG. 1, according to preferred embodiment of the invention.

Referring to FIG. 1, it is a cross-sectional view, schematically illustrating a package structure of optical device 100, according to preferred embodiment of the invention. The package structure of optical device 100 includes a chip 110, having an active surface 112 and back surface 114 in an opposite side. The active surface 112 of the chip 110 has an active zone 116, having multiple optical devices, such as the optical sensor, used for conversion between the optical signals and the electrical signals.

A sealant 122 encloses the optical devices 10 and is disposed on the active surface 112 of the chip 110. A cover 120 is disposed on the sealant 122, and is firmly adhered to the chip 110 by the sealant 122. The sealant 122 is mixed with spacers (not shown in figure), so as to allow the cover 120 to have a fixed gap from the chip 110. Moreover, the cover 120 can be a simple transparent cover, or a cover 120 that can also provide some optical properties, such as filtering or focusing. In other words, the cover 120 can be a filter plate or a lens.

The chip 110 can be firmly adhered to a substrate 150 by an adhering layer 142. Multiple chip connection pads 118 are additionally disposed on the active surface 112 of the chip 110, so as to electrically connect to the first connection pads 156 on the upper surface of the substrate 150 by multiple bonding wires 140. The substrate 150 also has multiple circuit line 152, so as to electrically connect the first connection pads 156 to the second connection pads 154 on the lower surface of the substrate 150. A transparent encapsulant 130 encloses the chip 110, the cover 120, the bonding wires 140 and the upper surface of the substrate 150. The second connection pad 154 can be electrically connected and firmly mounted on an external printed circuit board (not shown) by a surface mounting technology. In other words, the package structure of optical device 100 has the package structure of land grid array. The ordinary skilled artisans can understand that the second connection pad 154 can be easily changed with solder balls or connection pins, so as to form the structures of the ball grid array or pin grid array.

Figure 3:
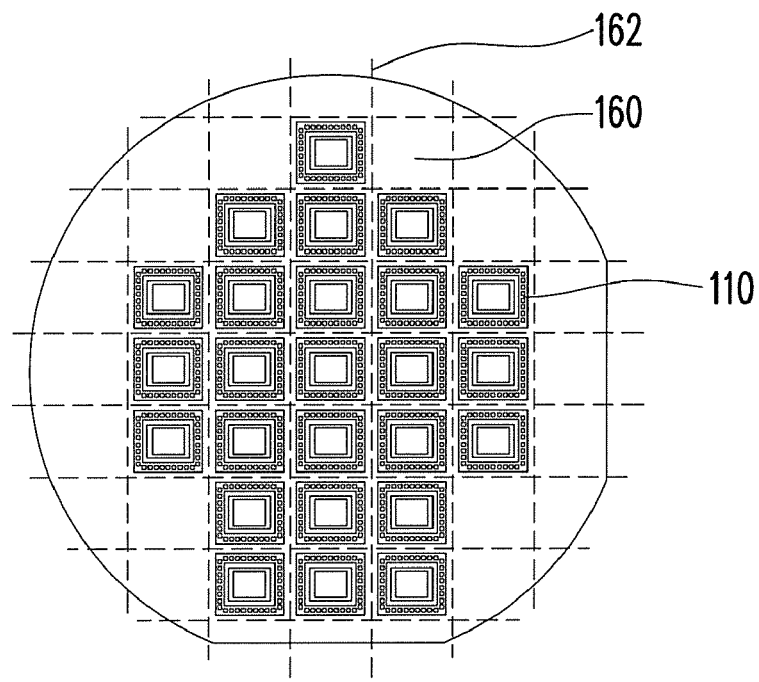
FIGS. 3-9 are drawings, schematically illustrating the fabrication processes for the package structure of optical device, according to the invention.
Figure 4:
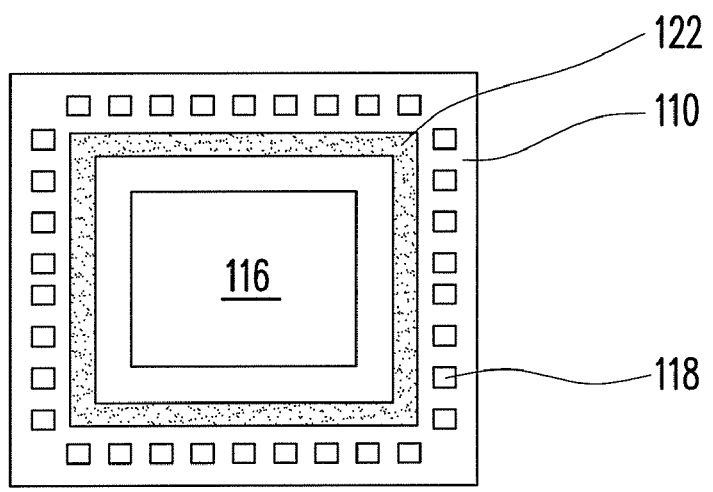

Referring to FIGS. 3-9, they are the drawings schematically illustrating the fabrication processes for the package structure of optical device 100, according to an embodiment of the invention. In FIG. 3, according to the fabrication process of the invention, a wafer 160 is provided. The wafer 160 has multiple chips 110 and multiple first cutting lines 162, so as to define the chips 110. Each chip 110 has an active zone 116 and multiple chip connection pads 118, which are disposed around the active zone 116. Then, a sealant 122 is dispensed to each chip 110 by a dispenser (not shown), so as to enclose the active zone 116. The chip connection pads 118 are located at outside of the sealant 122, as shown in FIG. 4 in detail.

Figure 5:
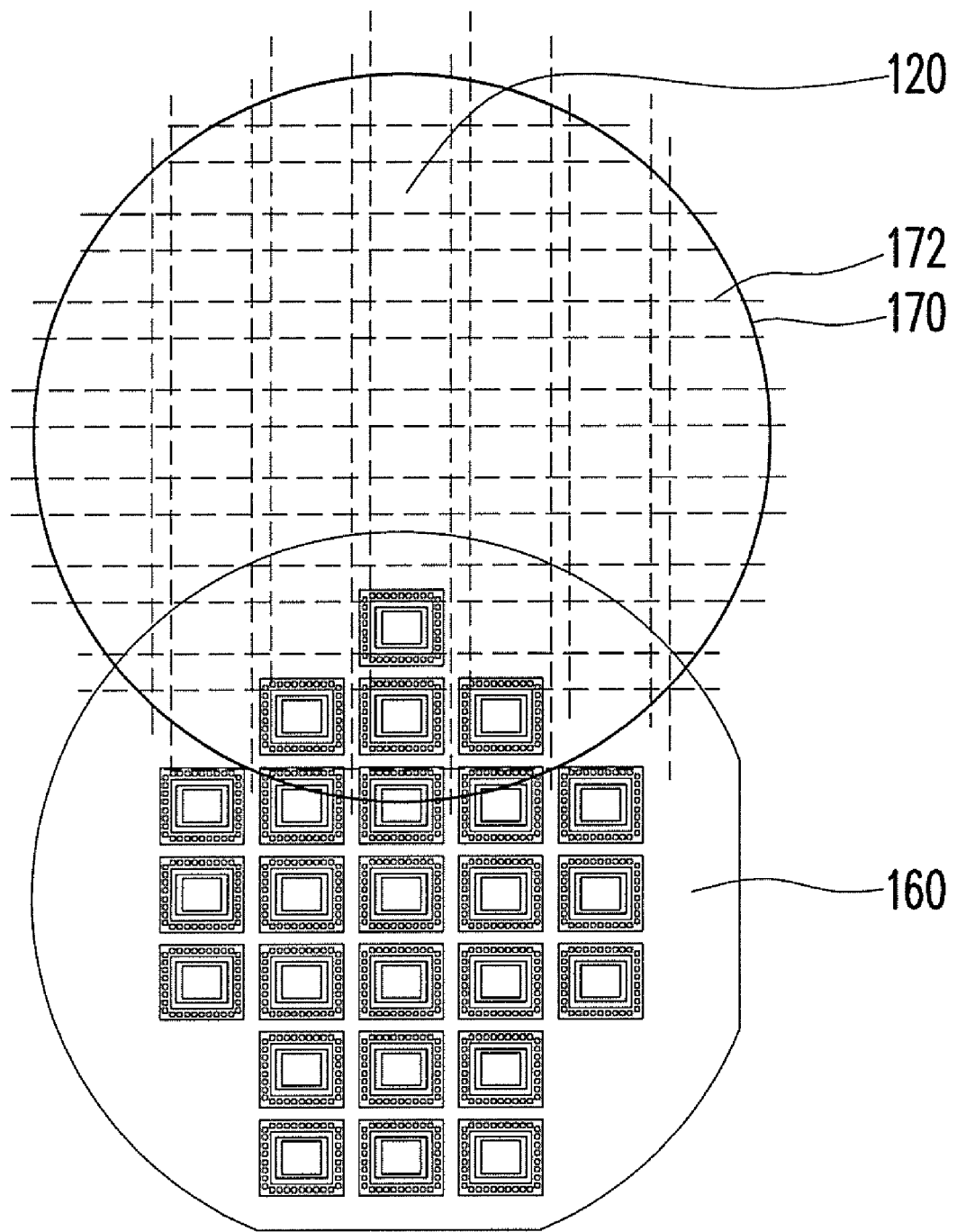

Referring to FIG. 5, a cover substrate 170 is disposed over the wafer 160. The cover substrate 170 has multiple covers 120 and multiple second cutting lines 172, so as to define the covers 120. As previously described, the cover substrate 170 can be a transparent plate, an optical filtering plate, or can have multiple lenses. The sealant 122 can be ultraviolet cure adhesive, mixed with spacers (not shown). After the cover substrate 170 is aligned with the wafer 160 and is disposed over the wafer 160, the sealant 122 can be cured by the ultraviolet light. As a result, the cover 120 can be adhered onto the chips 110 by a substantially uniform spacing, and a cavity with uniform spacing is formed above the active zone 116.

Figure 6:
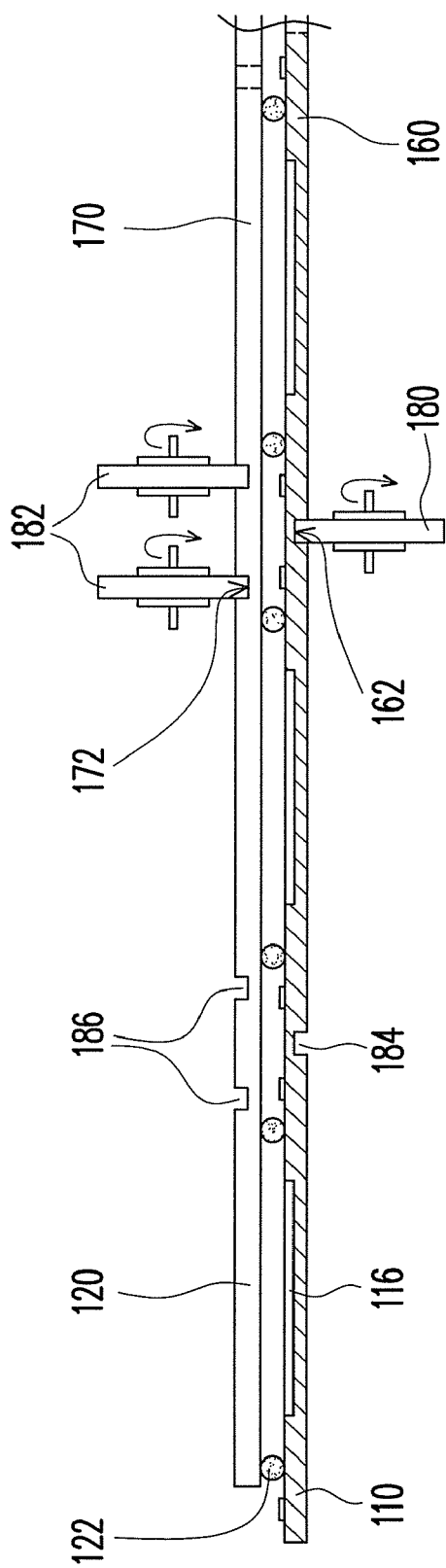
Figure 7:
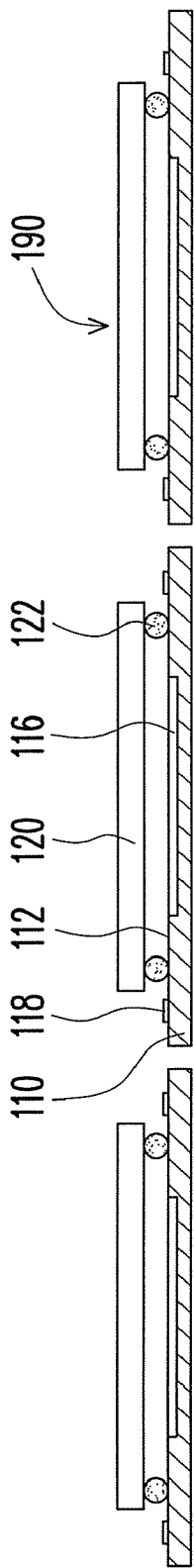

Referring to FIG. 6, the cutting devices 180 and 182 cut the wafer 160 and the cover substrate 170 along the first and second cutting lines 162 and 172 respectively on the wafer 160 and the cover substrate 170. Thereby, by the cutting process, the wafer 160 and the cover substrate 170 are cut into several singulated pieces, and then the multiple package structures 190 are formed. Preferably, the wafer 160 and the cover substrate 170 are processed to form multiple grooves 184, 186. Then, in the subsequent process, the wafer 160 and the cover substrate 170 are broken at the grooves 184, 186 by a breaking process, and then the package structures 190 are formed as shown in FIG. 7.

Figure 8:
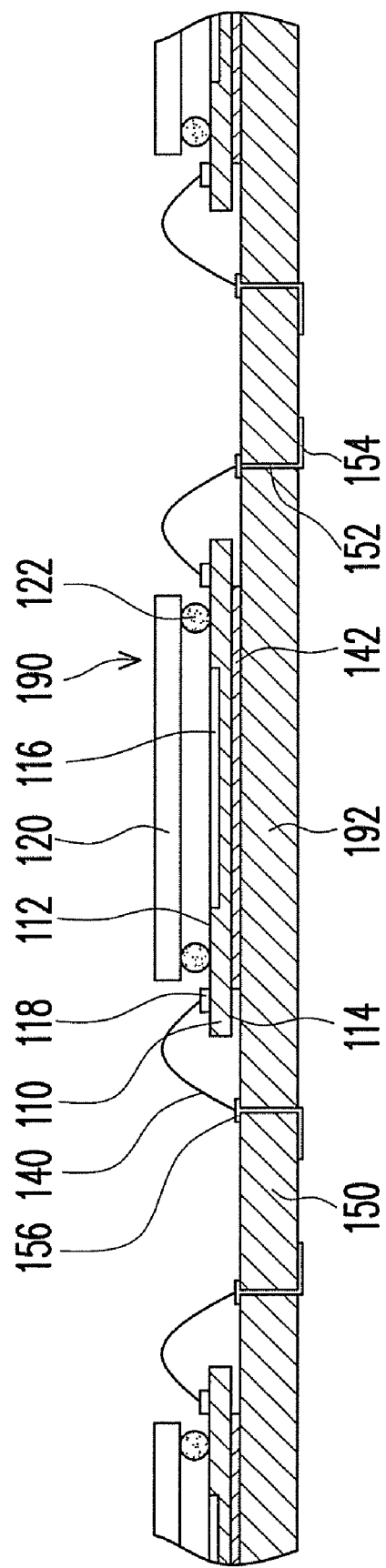

In FIG. 8, according to the fabrication process of the invention, a substrate strip 192 is provided, in which multiple substrates 150 are included, and are arranged by an array manner. The package structures 190 can be respectively adhered to the substrates 150 of the substrate strip 192 by multiple adhering layers 142. The bonding wires 140 are used to electrically connect the chip connection pads 118 of the chip 110 to the first connection pads 156 of the substrates 150.

Figure 9:
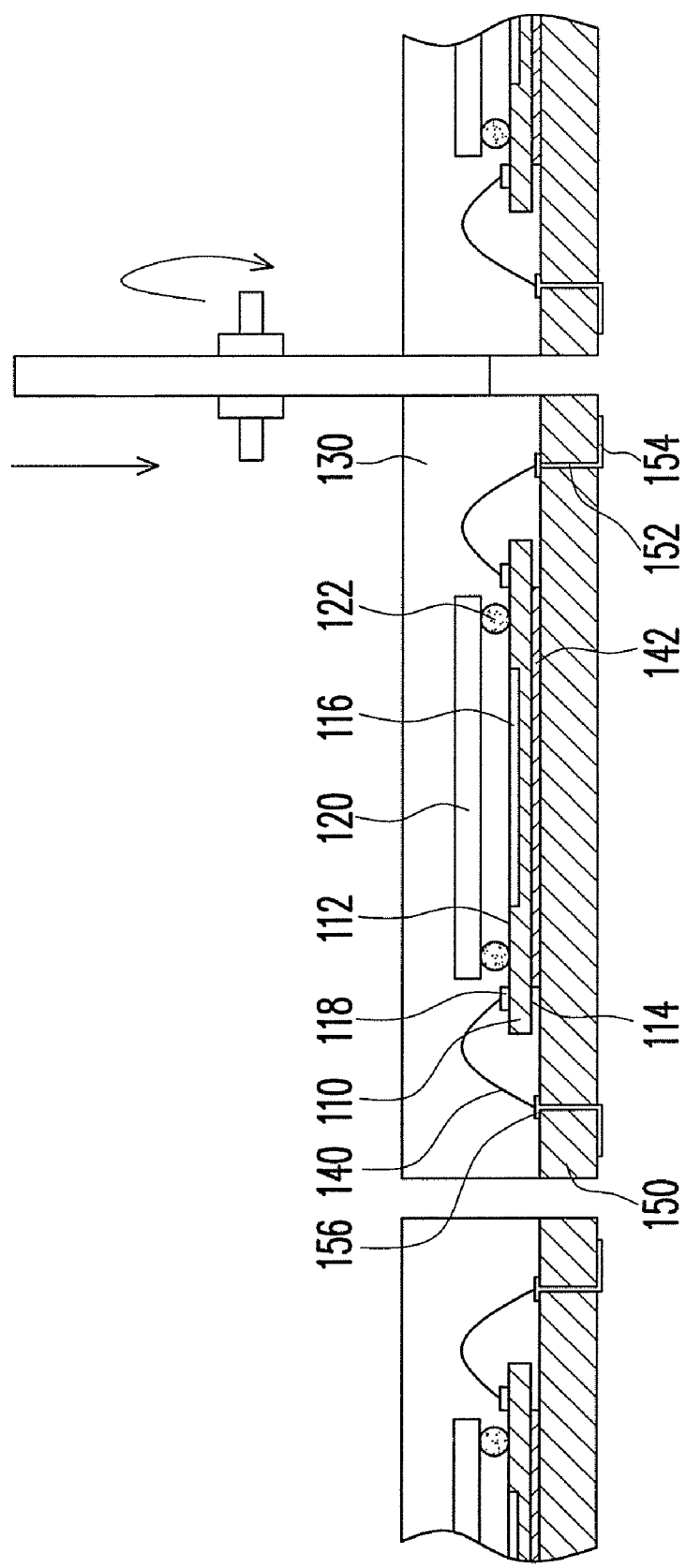

In FIG. 9, the transparent encapsulant 130 is formed by a transparent molding compound to mold onto the substrate strip 192, so as to encapsulate the package structure 190, the bonding wires 140, and the upper surface of the substrate 150. After then, the substrate strip 192 is cut and the package structure of optical device 100 is formed.

As the foregoing descriptions, according to the invention, the package structure of optical device is a land grid array structure. However, the ordinary skilled artisans can understand that the second connection pads 154 can be easily changed with solder balls or connection pins, so as to form the structures of the ball grid array or pin grid array.

According to the invention, the package structure of optical device has a cover, covering over the optical device of the chip, whereby it is helpful to avoid the moisture and reduce warpage. The package structure of optical device can use a usual substrate without need of expensive ceramic or bismaleimide triasine resin as the substrate. As a result, the fabrication cost can be greatly reduced. Moreover, since the package structure has no the outer pins, the signal transmitting path is shorter and thereby it has better electric properties.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A fabrication method for a package structure of an optical device, comprising:

providing a wafer, having a plurality of chips and a plurality of first cutting lines for separating the chips, and each of the plurality of chips having an optical device and a plurality of chip connection pads;

dispensing a sealant to each of the plurality of chips of the wafer, and enclosing the optical device of the chip;

providing a cover substrate, having a plurality of covers and a plurality of second cutting lines for separating the covers, each of the plurality of covers is corresponding to the optical device of the chips, and each of the plurality of covers is a lens or an optical filtering plate;

disposing the cover substrate over the wafer and aligning the cover substrate with the wafer, so that each of the plurality of covers the optical device of the corresponding chip;

curing the sealant;

cutting the wafer and the cover substrate along the first cutting lines and the second cutting lines, so as to form a plurality of pre-package structures, wherein each of the pre-package structures comprises the chip, the sealant and the cover;

providing a substrate strip, having a plurality of substrates, wherein each of the plurality of substrates has a plurality of first connection pads;

affixing the pre-package structures to the substrates of the substrate strip;

electrically connecting the chip connection pads of the chips to the substrates by a plurality of bonding wires;

molding an encapsulant over the substrates, so as to package the pre-package structures and the bonding wires; and cutting the substrates and the encapsulant, for forming the package structure of the optical device.

2. The fabrication method of claim 1, wherein each of the substrates further includes a plurality of second connection pads, electrically connected to the first connection pads, so as to be connected to an external circuit apparatus.

3. The fabrication method of claim 2, wherein each of the substrates further includes a plurality of circuit lines, so as to electrically connect the first connection pads to the second connection pads.

4. The fabrication method of claim 1, wherein the sealant provides a plurality of spacers, so as to maintain a uniform spacing between the covers and the chips.

5. The fabrication method of claim 1, wherein during the step of respectively cutting the wafer and the cover substrate to form the pre-package structures, the wafer and the cover substrate are cut along the first cutting lines and the second cutting lines but not cut through.

6. The fabrication method of claim 5, wherein the step of respectively cutting the wafer and the cover substrate for forming the pre-package structures further comprises a breaking process to form the pre-package structures.

7. The fabrication method of claim 1, wherein during the step of respectively cutting the wafer and the cover substrate to form the pre-package structures, the wafer and the cover substrate are cut along the first cutting lines and the second cutting lines to form a plurality of grooves thereon.

8. The fabrication method of claim 7, wherein the step of respectively cutting the wafer and the cover substrate for forming the pre-package structures further comprises a breaking process to form the pre-package structures.

9. A fabrication method for a package structure of an optical device, comprising:

providing a wafer, having a plurality of chips and a plurality of first cutting lines for separating the chips, each of the plurality of chips having an optical device;

dispensing a sealant on the chips of the wafer around the optical device of the chip;

providing a cover substrate, having a plurality of covers and a plurality of second cutting lines for separating the covers, wherein each of the plurality of covers is corresponding to the optical device, and each of the plurality of covers is a lens or an optical filtering plate;

disposing the cover substrate over the wafer and aligning the cover substrate with the wafer, so that each of the plurality of covers the optical device of the corresponding chip;

curing the sealant;

cutting the wafer and the cover substrate along the first cutting lines and the second cutting lines, for forming the package structure of optical device, wherein each of the pre-package structures comprises the chip, the sealant and the cover.

10. The fabrication method of claim 9, wherein the sealant provides a plurality of spacers, so as to maintain a uniform spacing between the covers and the chips.

11. The fabrication method of claim 9, wherein during the step of cutting the wafer and the cover substrate along the first cutting lines and the second cutting lines for forming the package structure of optical device, the wafer and the cover substrate are not cut through.

12. The fabrication method of claim 11, wherein the step of cutting the wafer and the cover substrate for forming the package structure of optical device further comprises a breaking process to form the package structures.

13. The fabrication method of claim 9, wherein during the step of cutting the wafer and the cover substrate along the first cutting lines and the second cutting lines for forming the package structure of optical device, the wafer and the cover substrate are cut to form a plurality of grooves thereon.

14. The fabrication method of claim 13, wherein the step of cutting the wafer and the cover substrate for forming the package structure of optical device further comprises a breaking process to form the package structures.

* * * * *